(12) United States Patent
Mok

(10) Patent No.: US 8,176,972 B2
(45) Date of Patent: May 15, 2012

(54) COMPLIANT VAPOR CHAMBER CHIP PACKAGING

(75) Inventor: Lawrence S. Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 943 days.

(21) Appl. No.: 11/513,786

(22) Filed: Aug. 31, 2006

(65) Prior Publication Data

US 2008/0053640 A1    Mar. 6, 2008

(51) Int. Cl.
*H05K 7/20* (2006.01)

(52) U.S. Cl. ............... 165/46; 165/104.26; 165/104.33; 361/700

(58) Field of Classification Search .............. 165/46, 165/104.26, 104.33; 361/700
See application file for complete search history.

(56) References Cited

U.S. PATENT DOCUMENTS

| | | | | |
|---|---|---|---|---|
| 3,618,660 A * | 11/1971 | Busse | ...................... | 165/104.26 |
| 3,649,738 A * | 3/1972 | Andersson et al. | .............. | 165/46 |
| 3,952,797 A * | 4/1976 | Voboril et al. | ........... | 165/104.26 |
| 4,072,188 A * | 2/1978 | Wilson et al. | ................... | 165/46 |
| 4,313,492 A * | 2/1982 | Andros et al. | ........... | 165/104.26 |
| 4,381,032 A * | 4/1983 | Cutchaw | ........................ | 165/46 |
| 4,402,358 A * | 9/1983 | Wolf | ........................ | 165/104.26 |
| 4,519,447 A | 5/1985 | Wiech, Jr. | | |
| 4,730,666 A * | 3/1988 | Flint et al. | ........................ | 165/46 |
| 4,796,155 A | 1/1989 | Saito et al. | | |
| 4,833,567 A | 5/1989 | Saaski et al. | | |
| 4,912,548 A | 3/1990 | Shanker et al. | | |
| 4,951,740 A * | 8/1990 | Peterson et al. | .......... | 165/104.33 |
| 4,964,458 A * | 10/1990 | Flint et al. | ........................ | 165/46 |
| 5,046,552 A * | 9/1991 | Tousignant | ...................... | 165/46 |
| 5,132,873 A * | 7/1992 | Nelson et al. | .................. | 361/701 |
| 5,168,348 A * | 12/1992 | Chu et al. | ........................ | 257/713 |
| 5,198,889 A * | 3/1993 | Hisano et al. | ................. | 257/678 |
| 5,257,162 A * | 10/1993 | Crafts | ........................... | 361/704 |
| 5,491,363 A * | 2/1996 | Yoshikawa | ........................... | 361/700 |
| 5,685,363 A * | 11/1997 | Orihira et al. | ..................... | 165/46 |
| 6,082,443 A * | 7/2000 | Yamamoto et al. | ....... | 165/104.26 |
| 6,622,782 B2 * | 9/2003 | Malhammar | ................... | 165/46 |
| 2004/0052050 A1 * | 3/2004 | Koning et al. | ................. | 361/700 |
| 2004/0052052 A1 * | 3/2004 | Rivera | .......................... | 361/700 |
| 2004/0194915 A1 * | 10/2004 | Belady et al. | ................... | 165/46 |
| 2007/0146996 A1 * | 6/2007 | Herring et al. | ................ | 361/700 |

* cited by examiner

*Primary Examiner* — Leonard R Leo

(74) *Attorney, Agent, or Firm* — Scully, Scott, Murphy & Presser, P.C.

(57) ABSTRACT

An arrangement for improving the cooling efficiency of semiconductor chips. One embodiment is to construct a vapor chamber with one compliant surface for improving the efficiency of transferring heat from a semiconductor chip to the vapor chamber, and another embodiment is to construct a vapor chamber with the chip substrate such that the chips are embedded inside the vapor chamber. One surface of the vapor chamber has a flexible structure to enable the surface of the vapor chamber to be compliant with the surface of a chip or a heat sink device.

7 Claims, 1 Drawing Sheet

FIG. 1
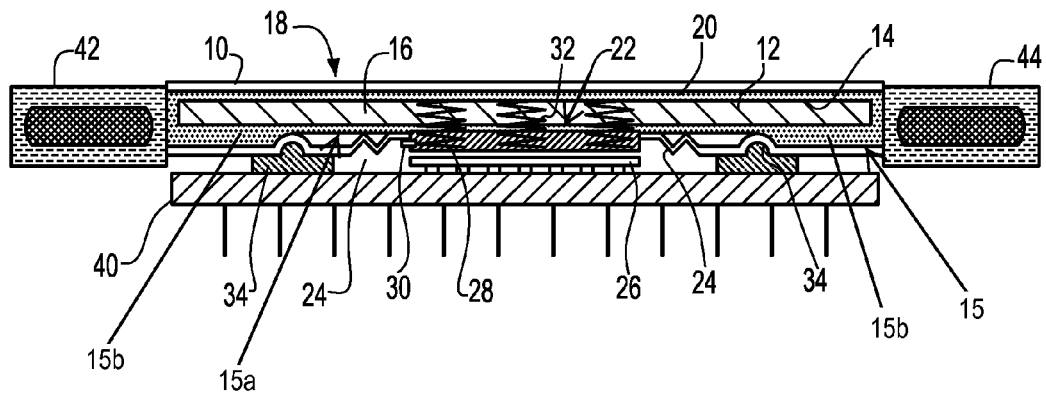
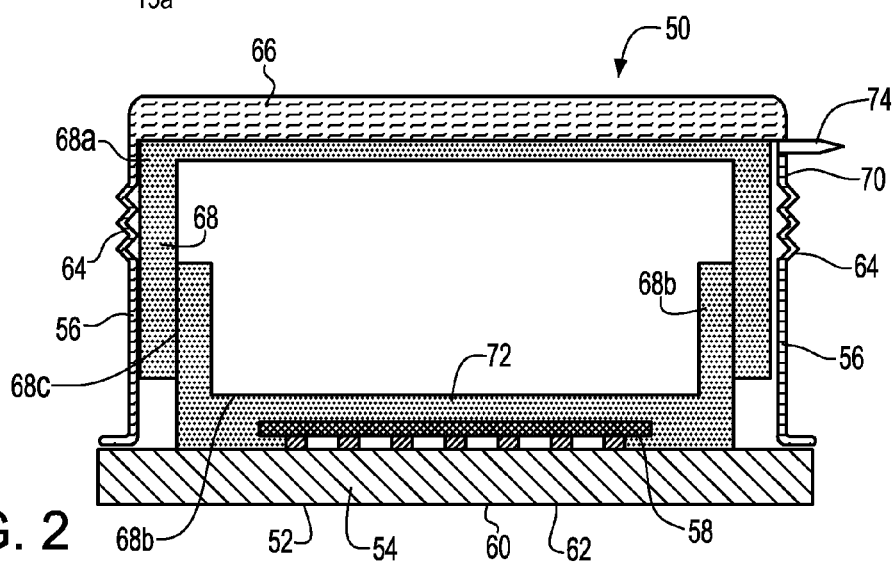
FIG. 2
FIG. 3
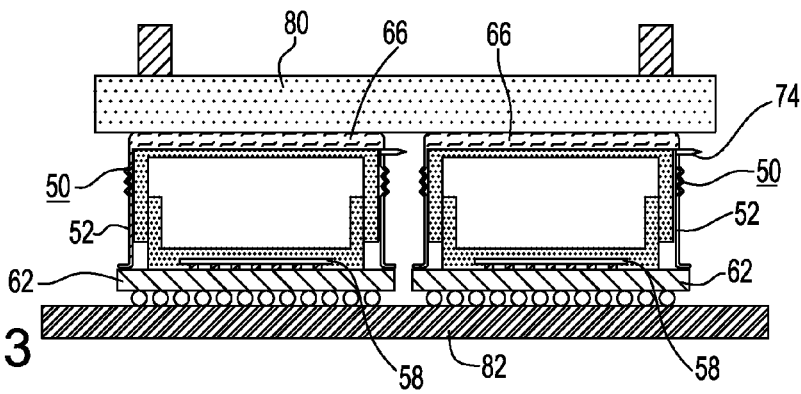

though it is partially filled with a
COMPLIANT VAPOR CHAMBER CHIP PACKAGING

BACKGROUND OF THE INVENTION

1. Field of the Invention

The present invention relates to a method of semiconductor chip cooling. The invention further provides for an arrangement to improve the cooling capability of semiconductor chips, as well as the requisite mechanical structure to achieve an efficient degree of cooling.

A problem which is prevalent in the electronics industry, resides in the difficulties encountered in transferring heat generated from a semiconductor chip to a heat sink arrangement or device for cooling of the semiconductor chip. The presently encountered increase in semiconductor chip power and power density are frequently accompanied by a rise in the thermal resistance between the semiconductor chip and a heat sink device. The prevalent traditional employment of a thermal grease may readily reach its maximum upper limit to provide a low thermal resistance, which is demanded because of its low thermal conductivity and the requirement for providing a close-fitted mechanical structure so as to ensure a satisfactory performance thereof. An improved semiconductor chip thermal interface, as well as a superior mechanical interface between the semiconductor chip and its heat sink device while subjecting the chip to only a low mechanical stress, is therefore a need which must be met in the technology.

2. Discussion of the Prior Art

Currently, various publications are directed to solving of the problems encountered in transferring heat from heat-generating components to heat sink structures through the employment of diverse heat conveying and spreading methods of which the following are representative.

Saaski, et al., U.S. Pat. No. 4,833,567, disclose a method of placing electronic components inside an integral heat pipe which consists of a condenser cap mounted on a substrate in order to form a sealed pipe chamber. Multi-layered wicks are placed between the condenser and the electronic components, so as to facilitate the transfer of heat away from the electronic components.

Shanker, et al., U.S. Pat. No. 4,912,548, are concerned with a method of inserting a heat pipe through the lid of a semiconductor-chip housing whereby the heat pipe terminates within the housing cavity at the hot end of the heat pipe, and enables the transfer of heat to a cold end thereof.

Saito, et al., U.S. Pat. No. 4,796,155, teach a method of housing a solid state device inside a coolant vessel containing a liquid coolant with the presence of a vapor space, and which is adapted to provide a coolant vapor to cool the solid state device.

Wiech Jr., U.S. Pat. No. 4,519,447, discloses two methods for cooling a substrate, one method employing a flat vapor chamber for heat spreading, and the other method utilizing a magnetohydrodynamically-driven liquid cooling plate to form a heat transferring path for cooling the substrate.

SUMMARY OF THE INVENTION

Accordingly, pursuant to the present invention, a first method and arrangement for cooling a semiconductor chip resides in locating a vapor chamber with a compliant surface facing the chip, which is located underneath the chamber. A second method positions a chip inside a semiconductor vapor chamber that possesses compliant chamber walls, whereby the first method can be applied to a chip package that is constituted as a separate entity, whereas the second method provides an improvement thermally, but requires modifications of the chip package to include the vapor chamber structure.

In accordance with the foregoing, pursuant to the first method or embodiment of the vapor chamber with a compliant surface, the chamber is mounted on a semiconductor chip package, with a center member on one surface of the vapor chamber being encompassed by a corrugated or resiliently flexible structure enabling the center member to move up and down relative to the therebeneath located chip surface. The center member possesses a good thermal interface relative to the chip surface from which heat generated by the chip is transferred, thereby cooling the chip.

Pursuant to the second method, the chip packaging substrate is employed to form the vapor chamber, with the vapor chamber walls and the semiconductor chip being mounted on the substrate within the vapor chamber. The vapor chamber has an encompassing corrugated structure enabling the upper part of the vapor chamber to be reciprocated up and down to match the surface of a heat sink device, and to provide a superior thermal contact in order to efficiently remove heat from the semiconductor chip.

BRIEF DESCRIPTION OF THE DRAWINGS

Reference may now be made to the following detailed description of preferred embodiments of the invention, as illustrated in the accompanying drawings; in which:

FIG. 1 illustrates a generally diagrammatic cross-sectional view of a compliant vapor chamber mounted on a semiconductor chip package;

FIG. 2 illustrates a cross-sectional view of a compliant vapor chamber with a semiconductor chip embedded inside thereof; and FIG. 3 illustrates a cross-sectional view of two compliant vapor chambers sharing a common heat sink device.

DETAILED DESCRIPTION OF THE INVENTION

Referring in particular to the drawings, FIG. 1 illustrates a cross-sectional view of an exemplary embodiment of a vapor chamber 10 with a compliant surface mounted on a chip package. As shown in the figure, the vapor chamber 10 includes a cavity 12 having a wick structure 14 constituted of suitable permeable materials, such as thin meshes, fibers, foams and other porous material compositions, which are adhered on the inner surface of the cavity walls of the vapor chamber 10, the latter of which is partially filled with a volatile fluid 16, for example, such as water, ethanol, butane, and so forth. The housing 18 forming the vapor chamber 10 is constituted of suitably selected thermally conductive materials that are compatible with the volatile fluids. One side 20 of the vapor chamber 10 is a flat surface whereas the opposite side thereof has a center member 22 at the middle, which is surrounded by a flexible corrugated ring 24. The flexible structure of the corrugated ring 24 allows the center member 22 to move slightly up and down or tilted in compliance with the semiconductor chip surface 26, which is located underneath the vapor chamber 10. Because of this structure, the gap between the center member 22 and the chip 28 can be made as thin and uniformly as possible in order to ensure a good thermal interface with the chip 28, to which center member 22 there is transferred heat generated by the chip 28. A section of thermal interface material 30 such as, for example, low melting point alloys of indium-bismuth-tin or indium-bismuth, is inserted between the center member 22 and the chip 28 so as to further reduce the thermal resistance between the center member 22 and the chip 28. When the chip package 40 is heated to a temperature which is higher than the melting point of these alloys; for instance, about 80° C., the alloys will melt and be compressed by the center member 22 based on the action of three forces; namely, from the spring force of the corrugated ring 24; springs 32, which are located inside the vapor chamber 10 at the location of the center member 22 and bearing thereagainst in a direction towards chip 28, and the internal vapor pressure which is generated in the vapor chamber 10. An elastomer barrier 34 extending about the chip 28 under the vapor chamber 10 prevents the residues of the melting alloys 30 from moving or to flow away from the chip package 40. Heat pipes 42 and 44, which are soldered to the perimeter of the vapor chamber 10, convey heat from the vapor chamber 10 to a heat sink device (not shown) which, if desired, may be located in an area distant from the chip package 40. In this illustrated arrangement, heat generated in the chip 28 is transferred to the center member 22 of the vapor chamber 10 through the interface material 30, which may be in the form of a layer. The volatile fluid 16 inside the vapor chamber 10 near the center member 22 absorbs the heat and vaporizes. The resultant vapor stream then travels across and through the cavity 12 and condenses in the wick structure 14 on the inner wall surfaces of the vapor chamber 10. The fluid 16 which condenses in the wick structure then flows back towards the center member 22 through the capillary force of fluids acting on the wicks. Heat is therefore released and transferred to the heat pipes 42 and 44, which, in turn, convey the heat to the distant (or proximate) heat sink device. For purposes of clarity, the ports for the evacuation from and filling of volatile fluids into the vapor chamber 10 are not shown in the drawing figure.

The housing 18 further includes an outer wall portion 15, as shown in FIG. 1. The outer wall portion 15 includes a recessed portion 15a. The recessed portion 15a is defined by a central portion of the outer wall portion 15, which is positioned between two end portions 15h. The central portion, and thereby the recessed portion 15a, has a first thickness, and each of the two end portions have a second thickness greater than the first thickness, such that the two end portions 15b define the recessed portion 15a therebetween.

The arrangement in FIG. 2 shows a cross-sectional view of another embodiment of an integrated vapor chamber 50 on a chip package 52. In this package 52, there is employed a packaging substrate 54 and the vapor chamber walls 56 to form vapor chamber 50. A semiconductor chip 58 is mounted on the substrate 54 within the vapor chamber 50. The packaging substrate 54 is of a vacuum-tight structure, and has vias and electrically conductive wires or traces (not shown) for connecting the semiconductor chip 58 to connection pads 60, which are located on the other side 62 of the substrate 54. The vapor chamber walls 56 have a bellows structure 64 extending thereabout for a portion of the height thereof, whereby the top part 66 of the vapor chamber 50 can be moved slightly up and down or tilted in order to be able to match or conform with the surface of a heat sink device (not shown). The top part 66 of the vapor chamber 50 can be selectively made of thermally-conductive materials, such as copper, copper alloys, aluminum, and the like. This resulting compliant constructional mechanism provides for a good thermal contact between the top part 66 of the vapor chamber 50 and the heat sink device. Wicks 68 which are arranged inside the vapor chamber 50 are adhered to the inner wall surface 70 of the vapor chamber 50, as well as to the surface of the backside 72 of the chip 58. There are basically two ways in which to arrange the wicks 68 in order to accommodate this compliant feature, one of which is shown in the figure and comprises two wick pieces 68a and 68b, which are overlapped at their ends such that fluids flowing in wick pieces 68a can pass to wick pieces 68b at the overlapping regions 68c. Alternatively, the wicks 68 at the overlapping regions 68c can be made from flexible materials such as fibers or thin meshes. A port 74 located on one wall 56 is for evacuation of the vapor chamber 50 and for filling the chamber with a predetermined amount of electrically-non-conductive volatile fluids that are compatible with the chamber materials; for example, such as water, ethanol, butane, or the like. Heat generated in the chip 58 heats up the fluids in the wick 68b proximate the chip area and causes the fluids to vaporize. The resultant vapor then flows across the vapor chamber and condenses in the wicks 68 within the region of the top part 66 of the vapor chamber 50. The heat released from the process of condensation is transferred to the heat sink device (not shown), which is preferably located in contact with the upper surface of the top part 66 of the vapor chamber 50. The condensed fluids will then flow back down into the region near the chip 58 and the vaporization and condensation cycle continues in a repetitive mode.

As disclosed in FIG. 3, this embodiment shows the cross-sectional view of two integrated vapor chamber chip packages 52, as in FIG. 2, sharing a common heat sink device 80 located on top thereof. The two integrated vapor chamber-chip packages 52 each have, respectively, a similar structure as the one shown in FIG. 2 and are designated by the same reference numerals. These two packages 52 are soldered to one common printed-wiring board 82. The common heat sink device 80, when placed on top of these two packages 52 can be constituted from a liquid-cooled cold plate or from an air-cooled heat sink. Because of the compliant feature of the integrated vapor chamber-chip package 52, a good thermal contact between the top part 66 of each of the vapor chambers 50 and the heat sink device 80 is independently ensured for each separate chamber-chip package 52. A piece of thermal interface material (now shown in the figure) can be placed between the common heat sink device 80 and the integrated vapor chamber chip packages 52.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A compliant sealed vapor chamber for the cooling of at least one semiconductor chip, comprising:
   a housing having a plurality of walls forming said vapor chamber including at least one flat wall and an opposite second spaced wall;
   heat pipes are being provided in contact with exterior peripheral surface of the walls of said vapor chamber;
   a corrugated resiliently flexible structure peripherally surrounding a center member of said opposite second wall so as to form a compliant wall structure; said center member being reciprocatably or tiltably displaceable relative to said one flat wall and in contact with said semiconductor chip, said center member being positioned in a recessed portion of an outer wall portion of said housing, said opposite second spaced wall having a central portion with a first thickness between two end portions having a second thickness greater than the first thickness, wherein said two end portions define said recessed portion therebetween;

at least one spring member extending between said one flat wall and said center member to exert a biasing forces against said center member towards a semiconductor chip arranged therebeneath externally of said vapor chamber;

a liquid-permeable wick arrangement lining the internal wall surfaces of said vapor chamber;

a volatile fluid filling a portion of the volume of said vapor chamber, whereby heat generated by said semiconductor chip is transferred into said vapor chamber and for further conduction therefrom, and a layer of an interface material being located intermediate said center member and said semiconductor chip, said interface material directly contacting said center member and said chip without intervening elements between said interface material and said center member, and said interface material and said chip;

said interface material being selected from the group of low melting point alloys consisting of indium-bismuth-tin and indium bismuth; and wherein an elastomeric barrier extends between said opposite wall of said vapor chamber and a substrate mounting said semiconductor chip so as to sealingly encompass said semiconductor chip.

2. A vapor chamber as claimed in claim 1, wherein the walls of the housing forming said vapor chamber are constituted of a heat conducting material selected from the group of materials consisting of copper, aluminum and alloys thereof.

3. A vapor chamber as claimed in claim 1, wherein said liquid-permeable wick arrangement comprises a material which is selected from the group of materials consisting of thin meshes, fibers foams and porous compositions.

4. A vapor chamber as claimed in claim 1, wherein the chamber interior is evacuated and partially filled with said volatile liquid which is chemically compatible with the material of said housing.

5. A vapor chamber as claimed in claim 4, wherein said volatile liquid is selected from the group of liquids consisting of water, ethanol or butane.

6. A method of utilizing a compliant sealed vapor chamber for the cooling of at least one semiconductor chip, said method comprising:

providing a housing having a plurality of walls forming said vapor chamber including at least one flat wall and an opposite second spaced wall;

arranging a corrugated resiliently flexible structure so as to peripherally surround a center member of said opposite second wall so as to form a compliant wall structure, said center member being positioned in a recessed portion of an outer wall portion of said housing, said opposite second spaced wall having a central portion with a first thickness between two end portions having a second thickness greater than the first thickness, wherein said two end portions define said recessed portion therebetween;

said center member being reciprocatably or titlably displaceable relative to said one flat wall and in contact with said semiconductor chip;

positioning at least one spring member to extend between said one flat wall and said center member for exerting a biasing forces against said center member towards a semiconductor chip arranged therebeneath externally of said vapor chamber;

lining the internal wall surfaces of said vapor chamber with a liquid-permeable wick structure;

filling a portion of the volume of said vapor chamber with a volatile fluid, whereby heat generated by said semiconductor chip is transferred into said vapor chamber and for further conduction therefrom;

locating a layer of an interface material comprising low melting alloys intermediate said center member and said semiconductor chip, said interface material directly contacting said center member and said chip without intervening elements between said interface material and said center member, and said interface material and said chip;

wherein said liquid-permeable wick arrangement comprises a material which is selected from the group of materials consisting of thin meshes, fibers foams and porous compositions;

wherein the chamber interior is evacuated and partially filled with said volatile liquid which is chemically compatible with the material of said housing, said volatile liquid being selected from the group of liquids consisting of water, ethanol or butane; and wherein an elastomeric barrier is arranged to extend between said opposite wall of said vapor chamber and a substrate mounting said semiconductor chip so as to sealingly encompass said semiconductor chip.

7. A method as claimed in claim 6, wherein said low melting alloys of the interface material layer are selected from the group of materials consisting of indium-bismuth-tin and indium-bismuth.

* * * * *